(12) United States Patent
Zhao et al.

(10) Patent No.: US 11,022,380 B2
(45) Date of Patent: Jun. 1, 2021

(54) HEAT PIPE WITH MICRO-PORE TUBE ARRAY AND HEAT EXCHANGE SYSTEM EMPLOYING THE HEAT PIPE

(75) Inventors: Yaohua Zhao, Beijing (CN); Kairong Zhang, Beijing (CN)

(73) Assignee: GUANGWEI HETONG ENERGY TECHOLOGY (BEIJING) CO., LTD, Beijing (CN)

( * ) Notice: Subject to any disclaimer, the term of this patent is extended or adjusted under 35 U.S.C. 154(b) by 296 days.

(21) Appl. No.: 13/127,444

(22) PCT Filed: Nov. 3, 2009

(86) PCT No.: PCT/CN2009/074775
§ 371 (c)(1),
(2), (4) Date: May 3, 2011

(87) PCT Pub. No.: WO2010/060342
PCT Pub. Date: Jun. 3, 2010

(65) Prior Publication Data
US 2011/0203777 A1 Aug. 25, 2011

(30) Foreign Application Priority Data

Nov. 3, 2008 (CN) .......................... 200810225649.8
Nov. 10, 2008 (CN) .......................... 200810225726.X
(Continued)

(51) Int. Cl.
*F28D 15/04* (2006.01)
*H01L 23/427* (2006.01)
(Continued)

(52) U.S. Cl.
CPC ............ *F28D 15/046* (2013.01); *B23P 15/26* (2013.01); *F24S 10/95* (2018.05);
(Continued)

(58) Field of Classification Search
CPC .... F28D 15/04; F28D 15/046; F28D 15/0266; F28D 15/0233; F28D 15/02; F28D 15/26
(Continued)

(56) References Cited

U.S. PATENT DOCUMENTS 4,392,007 A * 7/1983 Barkats et al. ............... 136/248
4,438,759 A * 3/1984 Kitajima et al. .............. 126/635
(Continued)

FOREIGN PATENT DOCUMENTS

CN 2223830 Y 4/1996
CN 2289176 Y 8/1998
(Continued)

OTHER PUBLICATIONS

PCT/CN2009/072362, International Preliminary Report on Patentability, dated May 3, 2011, 7 pages.
(Continued)

*Primary Examiner* — Jianying C Atkisson
*Assistant Examiner* — Jose O Class-Quinones
(74) *Attorney, Agent, or Firm* — Bayramoglu Law Offices LLC

(57) ABSTRACT

A heat pipe with micro tubes (2), includes a solid heat conductor (1) provided therein with two or more parallel micro tubes (2), the micro tubes being filled therein with working medium which exchanges heat through phase change; and the two ends of the heat conductor (1) are sealed and at least one of them is provided with a sealing strip of gradually shrinking shape that is formed from cold welding.

20 Claims, 9 Drawing Sheets

(30) Foreign Application Priority Data

| Feb. 27, 2009 | (CN) | 200910078903.0 |
|---|---|---|
| Mar. 10, 2009 | (CN) | 200910079411.3 |
| Mar. 24, 2009 | (CN) | 200910080178.0 |
| Mar. 24, 2009 | (CN) | 200910080179.5 |
| Jun. 19, 2009 | (WO) | PCT/CN2009/072362 |

(51) Int. Cl.
    *F28D 15/02*    (2006.01)
    *B23P 15/26*    (2006.01)
    *F28F 1/02*     (2006.01)
    *F24S 10/95*    (2018.01)

(52) U.S. Cl.
    CPC ..... *F28D 15/0233* (2013.01); *F28D 15/0283* (2013.01); *F28F 1/022* (2013.01); *H01L 23/427* (2013.01); *B23P 2700/09* (2013.01); *F28F 2260/02* (2013.01); *H01L 2924/0002* (2013.01); *Y02E 10/40* (2013.01); *Y10T 29/49353* (2015.01)

(58) Field of Classification Search
    USPC ......... 165/104.21, 104.26, 104.33, 143, 177; 29/890.032
    See application file for complete search history.

(56) References Cited

U.S. PATENT DOCUMENTS

| 4,830,100 | A | * | 5/1989 | Kato | F28D 15/0233 |
|---|---|---|---|---|---|
| | | | | | 126/635 |
| 5,029,389 | A | * | 7/1991 | Tanzer | F28D 15/0233 |
| | | | | | 165/104.21 |
| 5,309,457 | A | * | 5/1994 | Minch | 372/34 |
| 5,309,717 | A | * | 5/1994 | Minch | B25J 9/1085 |
| | | | | | 165/47 |
| 5,309,986 | A | * | 5/1994 | Itoh | 165/104.26 |
| 5,527,588 | A | * | 6/1996 | Camarda | B32B 3/20 |
| | | | | | 257/E23.088 |
| 5,697,619 | A | * | 12/1997 | Fierle | 277/345 |
| 5,737,840 | A | * | 4/1998 | Akachi | 29/890.032 |
| 6,163,073 | A | * | 12/2000 | Patel | 257/712 |
| 6,276,444 | B1 | * | 8/2001 | Li | 165/134.1 |
| 6,357,522 | B2 | * | 3/2002 | Dienhart et al. | 165/183 |
| 6,863,118 | B1 | | 3/2005 | Wang et al. | |
| 7,430,804 | B2 | * | 10/2008 | Hou et al. | 29/890.032 |
| 7,515,420 | B2 | * | 4/2009 | Wayman | 361/704 |
| 2004/0112572 | A1 | * | 6/2004 | Moon et al. | 165/104.21 |
| 2004/0163798 | A1 | * | 8/2004 | Ghosh | F28F 3/025 |
| | | | | | 165/104.21 |
| 2006/0016583 | A1 | * | 1/2006 | Kaspar et al. | 165/110 |
| 2006/0157228 | A1 | | 7/2006 | Moon et al. | |
| 2008/0073066 | A1 | * | 3/2008 | Chang et al. | 165/104.26 |
| 2008/0083656 | A1 | * | 4/2008 | Spicer et al. | 208/130 |
| 2008/0093055 | A1 | * | 4/2008 | Tzeng | F28D 15/0233 |
| | | | | | 165/104.26 |
| 2009/0040726 | A1 | * | 2/2009 | Hoffman et al. | 361/700 |

FOREIGN PATENT DOCUMENTS

| CN | 1307221 | A | 8/2001 |
|---|---|---|---|
| CN | 1564322 | A | 1/2005 |
| CN | 2786532 | Y | 6/2006 |
| CN | 1825577 | A | 8/2006 |
| CN | 101403578 | A | 4/2009 |
| CN | 101414644 | A | 4/2009 |
| CN | 101430141 | A | 5/2009 |
| CN | 10493296 | A | 7/2009 |
| JP | 2000035293 | A | 2/2000 |

OTHER PUBLICATIONS

PCT/CN2009/072362, International Search Report and Written Opinion (with English Translation), dated Sep. 24, 2009, 18 pages.
PCT/CN2009/074775, International Search Report and Written Opinion (with English Translation), dated Jan. 28, 2010, 16 pages.
PCT/CN2009/074775, International Preliminary Report on Patentability, dated May 3, 2011, 7 pages.

* cited by examiner

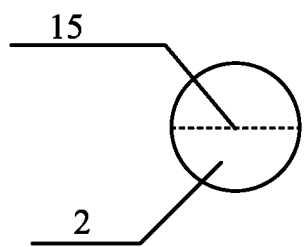
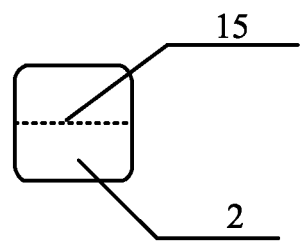
Figure 16a    Figure 16b
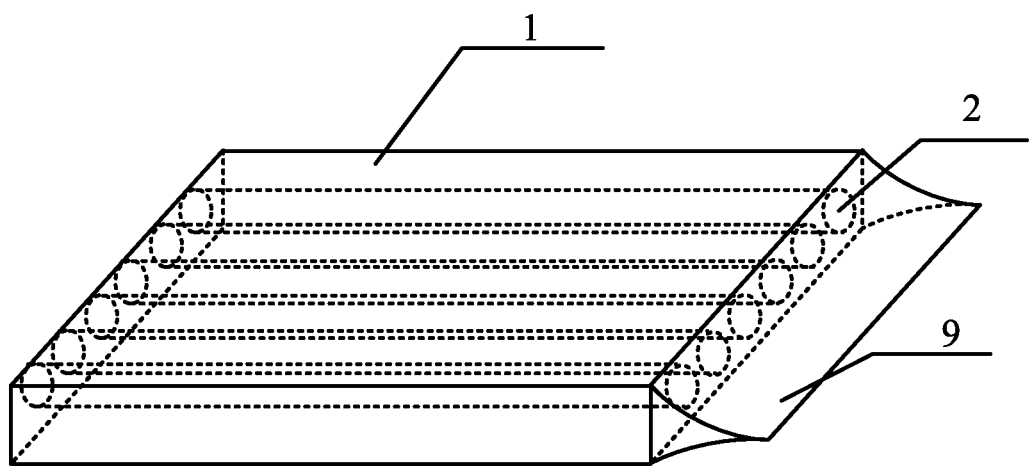
Figure 17

HEAT PIPE WITH MICRO-PORE TUBE ARRAY AND HEAT EXCHANGE SYSTEM EMPLOYING THE HEAT PIPE

TECHNICAL FIELD

The invention relates to the field of heat exchanging, particularly relates to a novel heat pipe which is used for heat conduction via phase-change and includes micro heat tube arrays, the manufacturing process therefor, and a novel heat-exchange system employing the novel heat pipe.

BACKGROUND ART

Compared with natural convection and forced convection manners, the heat exchangers that function in the phase-change principle are widely used in industries due to high heat conduction efficiency. The most typical phase-changer of this category is the heat exchanger using heat pipes. The main heat conduction mechanism of heat pipes is evaporation and condensation, which have a high heat conduction capacity, a desirable temperature controlling ability and a high heat conduction efficiency. Although the heat conduction efficiency of pulsating heat pipes is high, its application is limited due to the necessity of a temperature difference to be activated. The general heat pipe with porous wick suffers from its complicated fabrication process and its complex maintenance, therefore its application is also limited. In addition, the heat pipe of general type assumes a circular shape tube with a certain diameter in its cross section, thus leading to a small contact area with the elements to be cooled and a large equivalent heat resistance. In the prior art, the heat pipes are arranged side by side with metal conducting plates mounted therearound; or alternatively, the pipes are welded therebetween to constitute a juxtaposition structure so as to form a plate-shaped surface; in these manners the advantages of heat pipes can be fully profited. However, in the former case, the air cavities existing between the pipes lead to a large heat resistance, which does not only lower the heat conduction efficiency, but also renders the structure prone to deformation due to low endurance against pressure. In the latter case, the throughput is quite low due to low welding efficiency. Furthermore, poor welding that often occurs in welding work renders the heat pipes not applicable in situations with high pressure. Furthermore, in the prior art the heads of the heat pipes that are arranged side by side are sealed either by encapsulating heads, or in a two phase process, that is, the heat pipes are first sleeved into a bush, then the bush is welded with a cover at the open end thereof or the heads of the heat pipes are integratedly melt and soldered together. These processes are complex, and sealing property and reliability may be low.

SUMMARY

The invention is made to overcome disadvantages associated with the prior art heat pipes, that is, limited applications, low heat conduction efficiency and poor sustainability against pressure. The purpose of the invention is to provide a novel heat pipe with micro tube arrays, which can be utilized in many application fields, and possess a small heat resistance, a high heat conduction efficiency and a large endurance against pressure. The invention also provides a manufacturing process to prepare the novel heat pipe and a novel heat exchanging system employing the novel heat pipes.

The technologic solution according to the invention is as follows.

A heat pipe with micro tube arrays, characterized in that, it comprises a solid heat conductor provided therein with two or more parallel micro tubes, the micro tubes being filled therein with working medium which exchanges heat through phrase change; and the two ends of the heat conductor are sealed and at least one of them is provided with a sealing strip of gradually shrinking shape that is formed from cold welding.

The outer sides at the sealing strip of at least one longitudinal section of each micro tube shrink gradually along the length direction thereof to a point, with the outer sides being formed by two arcs that are concave with respect to each other.

The inner sides at the sealing strip of at least one longitudinal section of each micro tube shrink gradually along the length direction thereof to a point, with the inner sides being formed by two arcs that are concave with respect to each other.

The heat conductor has curled reinforcement welded joints formed by tin welding or high frequency welding at the end where the sealing strip is located.

The heat conductor is provided with protective caps around the outer part of the end where the sealing strip is located.

The micro tubes are parallelly arranged in a layer along the surface of the heat conductor that tightly contacts with the surface of the device to be cooled.

The heat conductor is a strip-shaped or plate-shape body, and the parallel micro tubes are parallel to the surface of the strip-shaped or plate-shape body that is wider in the cross direction.

The ratio of the length to the width of the cross section of the passage of the micro tubes is between ⅔ and 1.5, and the ratio of the minimal wall thickness of the heat pipe and the equivalent diameter of the micro tubes is not less than 0.2

The ratio of the extending length of the gradually shrinking sealing strip to the total thickness of the heat conductor ranges from 0.75 to 1.5 in the case that the total thickness of the heat conductor is less than 3 mm, it ranges from 0.6 to 1.5 in the case that the total thickness of the heat conductor is 3 mm to 5 mm, and it ranges from 0.5 to 1.5 in the case that the total thickness of the heat conductor is greater than 5 mm.

The micro tubes are arranged in two or more layers.

The equivalent diameter or the hydraulic diameter of the micro tube is between 0.1 mm and 8 mm, and there are at least two or more adjacent micro tubes having a distance from 0.1 mm to 1.0 mm.

The heat conductor is provided therein with one or more solid strip that extends in the direction parallel to the length direction of the micro tubes, and the solid strip is provided with mounting holes.

Each micro tube is an independent heat pipe.

One end of each micro tube is open in the heat conductor such that the micro tubes communicate with each other at the one end; this end of the heat conductor is closed, and the other end of each micro tube is closed; in this way the micro tube is of a semi-independent heat pipe structure.

The cross-section of the micro tube is polygonal, circular or oval; and in the case of polygonal cross-section, the vertexes of the polygon are rounded.

The inner wall of each micro tube is provided with micro-fins that enhance heat conduction or concave micro grooves that extend along the length direction of the micro tube; the micro-fins are sized and configured to form, with the inner walls of the micro tubes, micro grooves extending along the length direction of the micro tubes; the angles formed between the micro-fins and the inner wall of the micro tube and the angles formed between the micro grooves and the inner wall of the micro tube are smoothly rounded angle.

A novel heat-exchange system that employs the heat pipe with micro tube arrays as mentioned above.

The evaporation surface of the heat pipe contacts with the surface of devices to be cooled, and the other portion of the heat pipe is condensation surface.

One end of the heat pipe is located in the heat source, and absorbs and evaporates heat therefrom; the other end of the heat pipe is cooled through air or liquid from outside, and exothermic condensation is carried out by the steam within the heat pipe.

The heat-exchange system functions as a heat collector for a solar water heater, wherein solar radiation energy is absorbed and the liquid working medium evaporates at one end of the micro tubes; exothermic condensation occurs at the other end and heat is transferred to a heat-exchange device so as to generate hot water; and the condensation surface of the heat pipe contacts with water in the heat-exchange device directly, or alternatively contacts with the outside wall of the heat-conduction bladder of the hot water tank that functions as the heat collector.

The heat-exchange system functions as heat sink for solar photovoltaic cells or functions in a combined heat and power generation system wherein the evaporation surface of the heat pipe contacts with the backplate of the solar photovoltaic cells so as to absorb and evaporate heat therefrom, and the condensation surface of the heat pipe condenses in the heat-exchange device so as to generate hot water.

A manufacturing process for the heat pipe as mentioned above is characterized by comprising following steps:

A. producing the heat conductor with two or more parallel micro tubes that communicate with each other by extrusion or stamping;

B. sealing one end of the heat conductor;

C. discharging the air in the micro tubes and filling the liquid working medium thereinto;

D. sealing the other end of the heat conductor through cold welding in which the end of the heat conductor is squeezed by means of knife-edges, and thus is deformed, sealed and cut off.

Said manufacturing process is characterized in that the process of sealing one end of the heat conductor in Step B employs cold welding for sealing, wherein the one end of the heat conductor is squeezed by means of knife-edges, and thus is deformed, sealed and cut off.

Said manufacturing process is characterized in that the process of sealing one end of the heat conductor in Step B employs solder or high frequency welding to seal and reinforce the one end, or sleeve the one end by means of a bush to seal the end, after the end of the heat conductor is squashed and curled.

Said manufacturing process is characterized in that the following step is performed after the Step D:

E. the both ends of the heat conductor is provided with protective sleeves.

The heat conductor in the Step A is made of metal or alloy which is filled into an extrusion die for extrusion or into a stamping die for stamping after being heated to the softening temperature, wherein the extrusion die or the stamping die is provided with two or more parallel cylindrical punches; the heat conductor is cooled to normal temperature after being extruding or stamping.

The heat conductor is a strip-shaped body or a plate-shaped body, and the parallel micro tubes are arranged to be parallel to the surface of the strip-shaped body or the plate-shaped body which is wider in the cross direction.

The cylindrical punches of the stamping die or the extrusion die in Step A are provided with micro-pits or convex fins such that the inner walls of the micro tubes have micro-fins or micro concave grooves that enhance heat transfer.

Technical effects of the invention are as follows.

The invention provides a novel heat pipe with micro tubes arrays, including a heat conductor with parallel micro tubes. The heat conductor is sealed and is filled therein with working medium for exchanging heat through phase change, i.e., the micro tube is filled with working medium, becomes a micro heat pipe and carries out heat conduction through changing phrase, such that the heat pipe effect occurs naturally. The parallel arrangement of the micro tubes may also be deemed as a group of micro tubes constituting a micro tube cluster in which micro tubes may form one or more micro heat pipe. Due to the fact that the micro tubes are arranged within a holistic structure, easy manufacturing processes, such as extrusion and stamping, may be employed to prepare the hot pipe. Therefore the invention can be widely applied. At the same time, since the micro tubes are cavities that are formed in the heat conductor not through welding or providing metal heat transfer plates, the portion of the heat conductor itself between micro tubes acts as the reinforcement ribs and there is no air cavity between micro tubes. Therefore, the problems of low heat conduction efficiency which results from large thermal resistance due to air cavities, of tendency to deformation resulting from low resistance against inner pressure, and of low welding efficiency, are solved. Therefore, the heat conductor may considerably decrease the heat resistance of the novel heat pipe, therefore considerably increase its heat conduction efficiency. Meanwhile the resistance against the pressure and reliability are enhanced. The two ends of the heat conductor are sealed, and at least one of them is provided with a sealing strip of gradually shrinking shape that is formed from cold welding, which is a unique structure resulting from the process of cold welding. On the contrary, traditional processes to seal the end usually employ hot welding to cap the end of the hot pipe, or sleeve the hot pipe into a brush and then weld the open of the brush or then melt and solder the end. This production process is rather complicated. In this invention, the unique process of employing cold welding enable to seal the end of the heat pipe in one time so as to form a novel heat pipe with a unique sealing strip of gradually shrinking shape.

By providing a reinforcement welded joint and a protective cover, the sealing degree and antioxidant ability of the novel heat pipe according to the invention are increased.

Compared with prior art plate-shaped heat pipe, the novel heat pipe according to the invention features a higher heat absorbing efficiency of plate and a higher heat transportation efficiency of inner micro heat pipes due to employing a strip-shaped or plate-shaped body as the heat conductor. Meanwhile drawbacks of small contact areas that are associated with traditional heat pipes and pulsating heat pipes and drawbacks of the need of temperature difference to be activated for pulsating heat pipes are overcome, and production of micro wicks and complex maintenance associated with prior art processes of manufacturing the hot pipes are dispensed with. Furthermore, the drawbacks associated with the traditional plate-shaped heat pipes, that is, the resistance against inner pressure, the reliability, the maximal local heat-exchange flux density, and the maximal heat transportation capacity are considerably limited due to employing the structure of a single heat pipe, are overcome. The novel heat pipe features a wide application scope, a simply structure, high reliability and high heat conduction efficiency.

The micro tubes are arranged in a layer along the surface at which the heat conductor tightly contacts with the surface of the device to be cooled, such that the heat conductor can contact with the surface of device to be cooled tightly and thus form a heat-exchange surface. In this way, even if the surface of the device to be cooled is a curved surface, the heat conductor can contact with the surface as much as possible so as to form a heat-exchange surface, which renders the equivalent heat resistance to be very small. Besides this, micro tubes that are located nearby the heat-exchange surface and are arranged in a layer increase the heat-exchange efficiency even further.

The ratio scope of the total thickness of the heat conductor to the extending length of the shrinking sealing strip being set according to the total thickness of the heat conductor is to make the strength of the sealing is high enough to endure an inner pressure higher than 2.0 Mpa, in this way to satisfy pressure requirement for different working media within the micro tubes to function in different working temperatures, such that the heat pipe may work in a variety of working conditions.

Micro tubes are arrange in the heat conductor in multiple layers, Therefore, even if the contact surface between the heat pipe and the device to be cooled is limited, heat conduction can occur among micro tube layers in turn, that is, the evaporation portion of the micro tubes in the first layer that contacts with the device to be cooled conducts heat to the micro tubes in the next second layer and renders an evaporation portion to be formed. In the case that there is provided with a third layer, the second layer will conduct heat to this third layer, and so on, till to the last layer. Evaporation occurs at the evaporation portion of each layer, and resulting stream flows to condensation portion of each micro tube. Liquefaction occurs at the condensation portion, and resulting liquid flows to the evaporation portion. In this way the circulation with each micro tube is completed. Moreover, heat can be conducted between condensation portions in different layers, so the total condensation efficiency can be increased; the maximum local density of heat exchange is increased as well. It is not necessary to decrease the distance between micro tubes that arranged side by side and the diameter of the micro tube itself. In addition, the arrangement of the micro tubes in multiple layers increases the strength and reliability of the heat pipe further.

The two ends of each micro tube are sealed so that each micro tube is an independent heat pipe structure, therefore the holistic reliability of the heat pipe is increased. Even in the case that one micro tube is broken, such as leaking, the other micro tubes will not be affected. Meanwhile, in the case that one end of each micro tube is connected and the other end is sealed so as to form a semi-independent heat pipe, there is no need to seal the one end of the micro tubes, thus lowering the requirement of vacuum degreed.

The inner wall of the passage of each micro tube is provided with micro-fins that enhance heat conduction, which further increases the heat-exchange capacity of the working medium through changing phrase. If the distance between the micro-fins is suitable, then micro-wicks will result. Meanwhile, since the specific surface area is increased significantly, the novel heat pipe features a much higher heat-exchange efficiency.

If the micro-fins are sized and configured to form, with the inner walls of the micro tubes, micro grooves extending along the length direction of the micro tubes, then the nominal heat flux density and the dual heat-exchange ability of the novel heat pipe can be increased significantly.

The invention also relates to a manufacturing process for the novel heat pipe, wherein the micro tubes are made by extrusion or stamping in a holistic structure. The heat conductor is wholly extruded or stamped into two or more parallel micro tubes that are arranged side by side. The air in the micro tubes is discharged therefrom and the liquid working medium is filled thereinto so as to form micro heat pipes, such that the heat pipe effect occurs naturally. Since a simply process, such as extrusion or stamping, is employed, production of micro wicks and complex maintenance associated with prior art processes of manufacturing the hot pipes are dispensed with. Moreover, since a holistic moulding process is employed, there is no need to carry out complex procedures, such as brazing in brazing furnace to prepare an integral structure. In the national standard of GB9082.1-88, the thickness of rounded heat pipe made of aluminum should be larger than 1.0 mm. However, since the micro tubes can support each other and enhance the strength thereof, the thickness of the novel heat pipe according to the invention can be decreased to 0.2-0.4 mm. If the traditional sleeving process is employed to seal the ends of the heat pipe with the wall thickness of this order, leaking tends to occur and the sealing degree is unfavorably affected. If the end is melt and brazed, it is very easy to break down. In the invention, the cold welding process is employed to seal the end, wherein the end of the heat conductor is squeezed by the knife-edges, and then is deformed and is cut off, forming a sealing strip of gradually shrinking shape. The sealing process can be carried out in one time, thus the process is simply, sealing property is high, possibility of leakage is low, and safety and reliability are increased. The manufacturing process for the novel heat pipe according to the invention are suitable for industrial mass production in the sense that heat conductors can be massively arranged on the production line, and be delivered to the next step after extrusion or stamping. It is easy to produce heat pipes in large quantity, so the production efficiency is high.

BRIEF DESCRIPTION OF THE DRAWINGS

FIG. 16a is a schematic view of a circular shape cross section of a micro tube showing the equivalent diameter according to the invention.

FIG. 16b is a schematic view of a rectangle shape cross section of a micro tube showing the equivalent diameter according to the invention.

FIG. 17 is schematic structure view showing one end of each micro tube is open in the heat conductor.

DETAILED DESCRIPTION OF THE PREFERRED EMBODIMENTS

Hereinafter the invention will be explained with reference to the accompanying figures.

Figure 2:
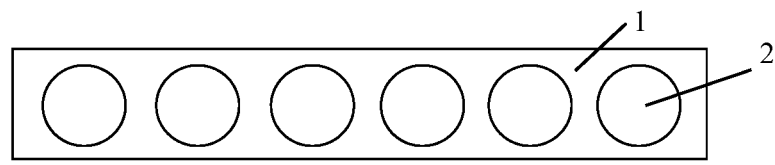
FIG. 2 is the schematic structure view of the first embodiment of the novel heat pipe according to the invention.

FIG. 2 is the schematic structure view of the first embodiment of the novel heat pipe according to the invention. The heat pipe comprises a solid heat conductor 1 that may be made of metal or alloy. In this embodiment the heat conductor 1 is a plate-shaped body provided with two or more parallel micro tubes 2 which are parallel to the surface of the plate-shaped body that is wider in the cross direction. The cross sections of the micro tubes 2 are circular. The micro tubes 2 are sealed in the heat conductor 1 and are filled with liquid working medium therein so as to form micro heat pipes which conduct heat through phase-exchange and naturally result in heat pipe effect. In this embodiment, the novel heat pipe is a plate structure made of metal which is squeezed or pressed into two or more thorough holes arranged side by side. In order to improve the heat flow density and the phase-exchange ability of the novel heat pipe, the equivalent diameters or the hydraulic diameters of the micro tubes 2 may range from 0.1 mm to 8 mm, preferably from 0.2 mm to 5 mm. The distance between two adjacent micro tubes may range from 0.1 mm to 1.0 mm. The preferable ratio of the length to the width of the cross section of the micro tubes may range from ⅔ to 1.5. The ratio of the minimum thickness of the novel heat pipe to the equivalent diameters of the micro tubes is no less than 0.2.

Both two ends of the heat conductor 1 are sealed and have sealing strips of gradually shrinking shape formed by cold welding. Both two ends of each micro tube 2 are sealed, and the outer and inner sides of at least one longitudinal section of each micro tube 2 at the sealing strip respectively shrink gradually along the length direction thereof to a point, preferably the outlines of the outer sides and inner sides are both two relatively concave curves. As shown in the longitudinal section of the heat pipe in FIG. 1, the heat conductor 1 has two cold welding joints 9 each with two concavely curved sealing strips gradually shrinking along the length direction thereof. Preferably a reinforcement welded joints can formed by tin welding, high frequency welding or other welding methods, at the end where the sealing strips exist. The welded joints are can provided with protective caps thereoutside. Suppose that the ratio of the extending length of the gradually shrinking sealing strip to the total thickness of the heat conductor is $\delta$, then $0.75 \le \delta \le 1.5$ when the total thickness of the heat conductor is not larger than 3 mm, $0.6 \le \delta \le 1.5$ when the total thickness of the heat conductor is between 3 mm and 5 mm, and $0.5 \le \delta \le 1.5$ when the total thickness of the heat conductor is larger than 5 mm. The relationship between the total thickness of the heat conductor and the extending length of the gradually shrinking sealing strip may be adjusted to ensure that the micro tube can endure inner pressure higher than 2.0 Mpa, in this way to satisfy pressure requirement for different working media within the micro tubes to function in different working temperatures, such that the heat pipe may work in a variety of working conditions. For example, when the total thickness of the heat conductor is 3 mm, the extending length of sealing strip of gradually shrinking shape may be set as 2.5 mm or 3 mm; and when the total thickness of the heat conductor is 4 mm, the extending length of sealing strip of gradually shrinking shape may be set as 2.8 mm or 3 mm, and so on.

An individual micro tube 2 may be in an independent or a semi-independent heat pipe structure. For example, in the case that both two ends of each micro tube 2 are closed, the micro tubes 2 are all in an independent heat pipe structure so as to constitute a micro heat pipe array. In this case, the micro tubes do not communicate with each other and may work independently, which improves its reliability and facilitates maintenance thereof. Specifically in the case of one of the micro tubes is out of order, e.g., leaking, other micro tubes will not be affected. When one end of each micro tube 2 is open in the heat conductor 1, the micro tubes may communicate with each other. This may be realized by capping a bush over the end of the heat conductor 1. In this way, the end of the conductor 1 is seamed and micro tubes 2 may communicate with each other at this end. Thus the micro tubes 2 assume a semi-independent heat pipe structure which integrally constitutes the heat pipe with micro tube arrays. Since the ends of the micro tubes are open, these ends do not need to be sealed, and thus the requirement on the degree of vacuum is lowered. However, welding work, such as argon arc welding, high frequency welding or brazing welding, is needed for this case in which ends of each micro tube is open in the heat conductor and the heat conductor is closed at this end. Furthermore, since the micro tube is a semi-independent heat pipe and communicates with others at the end, the entire structure is actually in a single heat pipe form. Thus, the heat pipe will be out of order even if only one single micro tube malfunctions since other micro tubes are affected. Therefore the reliability is relatively low.

Figure 3:
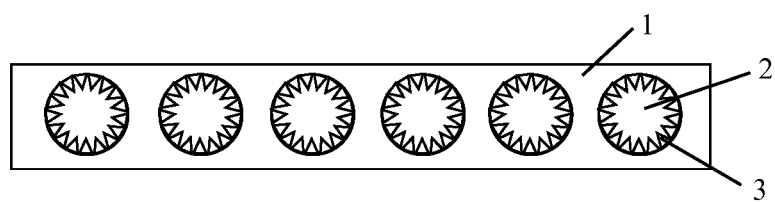
FIG. 3 is the schematic structure view of the second embodiment of the novel heat pipe according to the invention.

FIG. 3 is the schematic structure view of the second embodiment of the novel heat pipe according to the invention. The difference of the second embodiment from the first embodiment lies in the fact that there are a lot of micro-fins 3 made of heat conduction material on the inner wall of each circular micro tube. The distance between the micro-fins 3 that are adjacent to each other along the length direction of the novel heat pipe according to the invention may be rendered appropriate such that micro wicks may results. Furthermore, the configuration of micro grooves, micro-fins and micro wicks constituted by micro fins 3 which are adjacent to each other along the length direction of the novel heat pipe, which can be regarded as a micro tube group or a micro groove cluster, may improve heat exchanging capacity of the heat pipe.

Figure 4:
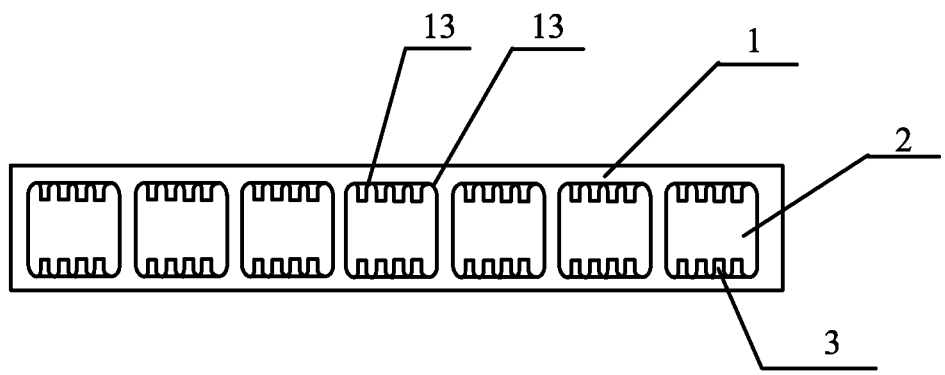
FIG. 4 is the schematic structure view of the third embodiment of the novel heat pipe according to the invention.

FIG. 4 is the schematic structure view of the third embodiment of the novel heat pipe according to the invention. In this embodiment, the cross section of the micro tube 2 is rectangle. Nevertheless, the shape of the cross section may be other polygons (such as triangular or square), or ellipse, or any other geometrical shapes that would not lead to stress concentration. In case of polygons, the vertices should be chamfered so as to form a rounded corner with a certain curvature, such as the rounded corner 13 in vertex of the rectangle as shown in FIG. 4. In this embodiment, the equivalent diameters or the hydraulic diameters of the micro tubes may be set as 0.1 mm to 3.5 mm, the opposite inner walls of each micro tube 2 of rectangle shape along the vertical direction are provided with the micro-fins 3 made of heat conduction material, or with micro grooves extending in the length direction of the micro tube 2. The micro-fins 3 which are adjacent along the length direction of the novel heat pipe constitute micro wicks therebetween. Furthermore, the micro-fins 3 which are adjacent along the length direction of the novel heat pipe constitute micro grooves. The corners formed by micro-fins 3 and the inner wall of the micro tubes 2 and the corners formed by concave micro grooves and the inner walls of the micro tubes 2 are chamfered to rounded corners so as to avoid stress concentrations. For example, a smooth and rounded corner 13 with a certain curvature is formed at the corner formed by the micro-fins 3 and the inner wall of the micro tubes 2 in FIG. 4. Similarly, the micro-fins 3 may be provided at the inner walls that are opposite to each other in a micro tube 2; or alternatively the micro-fins 3 may be provided on the one side, two sides, three sides or four sides of the inner walls of a micro tube 2.

Figure 5:
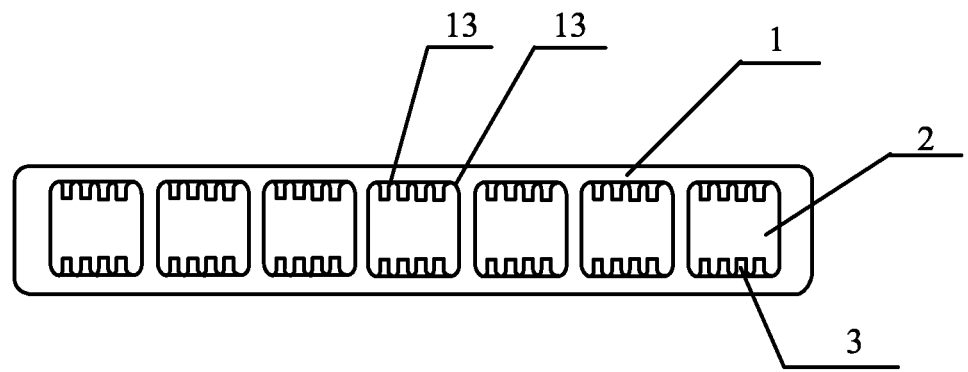
FIG. 5 is the schematic structure view of the forth embodiment of the novel heat pipe according to the invention.
Figure 6:
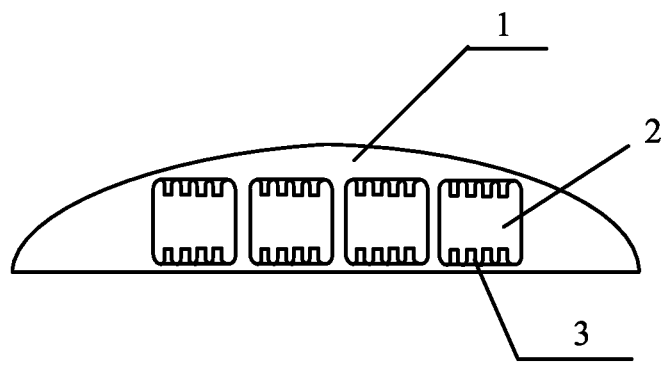
FIG. 6 is the schematic structure view of the fifth embodiment of the novel heat pipe according to the invention.

FIG. 5 is the schematic structure view of the forth embodiment of the novel heat pipe according to the invention. The difference of this embodiment from the third embodiment shown in FIG. 4 lies in the fact that the four corners of the heat conductor 1 in FIG. 4 are right angles, whereas the four corners of the heat conductor 1 in FIG. 5 are rounded corners which are not only easy for extrusion, but also facilitate carrying. The heat conductor 1 of the novel heat pipe according to the invention may assume a variety of shapes, as shown in FIG. 6 illustrating the fifth embodiment of the novel heat pipe according to the invention in which the heat conductor 1 assumes a semi-oval shape.

Figure 7:
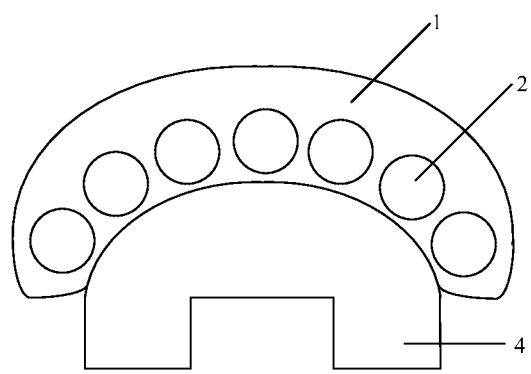
FIG. 7 is the schematic structure view of the sixth embodiment of the novel heat pipe according to the invention.

FIG. 7 is the schematic structure view of the sixth embodiment of the novel heat pipe according to the invention. The surface of the device 4 to be cooled is a curved surface. The micro tubes 2 are arranged along the surface at which the heat conductor 1 tightly contacts with the surface of the device 4 to be cooled, such that the heat conductor 1 can contact with the surface of device 4 to be cooled tightly and thus form a heat-exchange surface. Furthermore, the micro tubes 2 are arranged in layers near the heat-exchange surface, and the heat conductor 1 can contact with the surface of the device 4 to be cooled in a large area, so the equivalent heat resistance is very small and the heat-exchange efficiency is improved.

Figure 8:
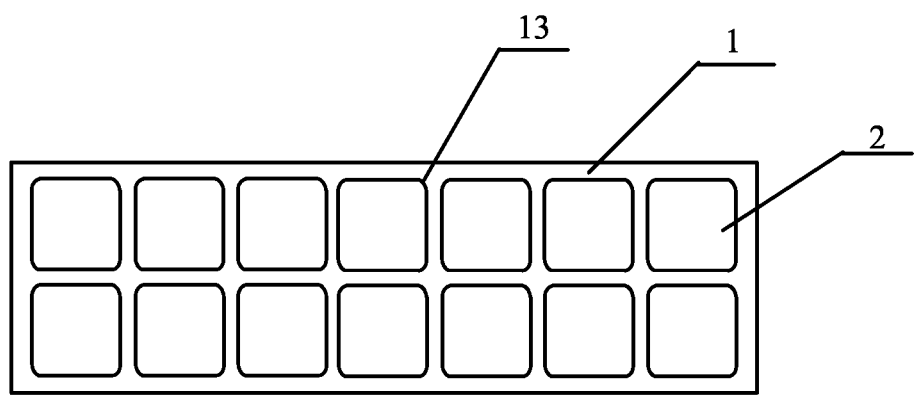
FIG. 8 is the schematic structure view of the seventh embodiment of the novel heat pipe according to the invention.

Micro tubes may be arranged in heat conductor in multiple layers, such as the schematic structure view of the seventh embodiment of the novel heat pipe according to the invention as shown in FIG. 8. In this embodiment, the micro tubes 2 are arranged in two layers in the heat conductor 1.

Figure 9:
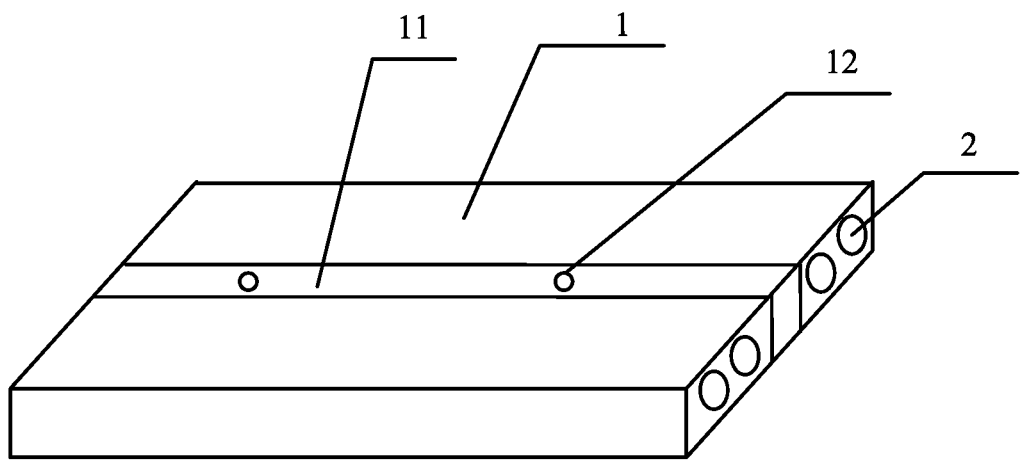
FIG. 9 is the schematic structure view of the eighth embodiment of the novel heat pipe according to the invention.

FIG. 9 is the schematic structure view of the eighth embodiment of the novel heat pipe according to the invention. In this embodiment, the heat conductor 1 is provided therein with a solid strip 11 that extends in the direction parallel to the length direction of the micro tubes 2. The solid strip 11 is provided with mounting holes 12 such that the novel heat pipe may be installed and secured at the target location through the mounting holes 12. Depending on the actual requirement, the solid strip 11 may be arranged in the central portion of the heat conductor 1, or be arranged sideward. Furthermore, there may be provided more than one the solid strip 11.

The invention also relates to a novel heat-exchange system, which comprises the novel heat pipe with micro tube arrays according to the invention. The novel heat-exchange system may function as a heat sink to electronic elements, a heat-exchange device of heat pipe type or a solar energy collector.

When the novel heat-exchange system according to the invention is used as a heat sink to cool electronic devices, such as a heat sink for CPU or other micro electronic chips, or a heat sink for LED or other large-power devices, or a heat sink for PVC, the evaporation surface of the novel heat pipe contacts with the heat surface of the electronic elements in a insulated manner so as to absorb heat from the devices automatically. The other part of the heat pipe is the condensation section. In this way the heat dissipation efficiency is high. Or alternatively, a certain part of one end of the novel heat pipe contacts with the heat surface, absorbs heat from elements and evaporates, and the other parts function as condensation section. Alternatively, one end of the novel heat pipe is located in the heat source and evaporates, with the other end being cooled through air or liquid, and the steam is condensed inside the heat pipe condenses, and thus heat is dissipated.

Specifically, when the novel heat-exchange system is used as micro-chip heat sink, the equivalent diameters of the micro tubes can be chosen to be 0.2 mm-6 mm. Furthermore, the inner wall of the micro tubes may be provided with micro-fins to enhance heat conduction. The distance between two adjacent micro-fins may be 0.01 mm-0.6 mm. The height of the micro-fins may be 0.02 mm-2 mm. Such a configuration does not only feature a high heat conduction capacity, but also significantly improves the anti-bending ability, the thermodynamic properties, and other mechanic properties. Preferably, the micro-fins are sized and configured to form, with the inner walls of the micro tubes, micro grooves extending along the length direction of the micro tubes. The width of the micro groove is 0.01 mm-0.4 mm, and its depth is 0.02 mm-0.7 mm. The liquid working medium is chosen to be suitable for the size and configuration of the micro grooves so as to enhance the heat flux density of the cooling process when the device is cooled. In this way the heat conduction efficiency can be significantly improved, and the microelectronics chip can be rapidly cooled down.

When the novel heat-exchange system is used as a heat sink for LEDs or other large power devices, the equivalent diameter of the micro tubes may be set as 0.5 mm-3 mm, Furthermore, the inner wall of the micro tubes may be provided with micro-fins to enhance heat conduction. The distance between two adjacent micro-fins may be 0.01 mm-0.5 mm. The height of the micro-fins may be 0.03 mm-1.5 mm. Such a configuration does not only feature a high heat conduction capacity, but also significantly improves the anti-bending ability, the thermodynamic properties, and other mechanic properties. Preferably, the micro-fins are sized and configured to form, with the inner walls of the micro tubes, micro grooves extending along the length direction of the micro tubes. The width of the micro groove is 0.01 mm-0.4 mm, and its depth is 0.03 mm-0.7 mm. The liquid working medium is chosen to be suitable for the size and configuration of the micro grooves so as to enhance the heat flux density of the cooling process when the LEDs or other large-power devices are cooled. In this way the heat conduction efficiency can be significantly improved, and the LEDs and other large-power devices can be rapidly cooled down. When the novel heat-exchange system is used as a heat-exchange device of heat pipe type, one end of the heat pipe is located in the heat source from which heat is to be dissipated, and the other end thereof is located in cold medium. In this manner, the heat pipe may efficiently conduct heat through evaporation and condensation by itself.

When the novel heat-exchange system is used for cooling solar photovoltaic cells (PVCs), or functions in a combined heat and power generation system, the evaporation surface of the novel heat pipe contacts with the backplate of the PVC tightly (e.g., through affixing or adhering) so as to absorb and evaporate heat generated by PVCs. The condensation surface of the novel heat pipe condenses in the heat-exchange device to generate hot water.

Figure 10:
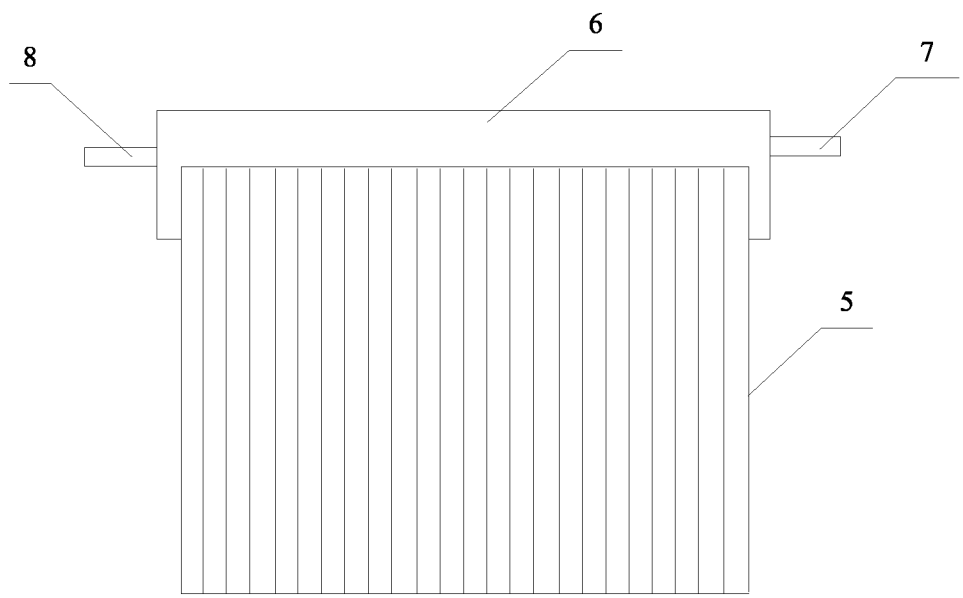
FIG. 10 is the schematic structure view of an embodiment of the heat pipe according to the invention, i.e., a solar energy collector.

The novel heat-exchange system according to the present invention may also be used as a heat collector for solar water heaters. As shown in FIG. 10 illustrating the schematic structure view of an embodiment, i.e., a solar energy collector of the novel heat pipe according to the invention, solar radiation energy is absorbed and the working liquid evaporates at one end of the micro tubes. At the other end of the novel heat pipe condensation occurs and hot water is generated. In this case, the solar energy collector comprises a heat-absorbing plate 5 constituted by the novel heat pipe, a heat-exchange device 6, and a water pipe 7 and a water pipe 8 which function as the input and output of the heat-exchange device, respectively, wherein the heat-absorbing surface of the heat-absorbing plate 5 is directly oriented toward sun so as to absorb solar energy, and the heat-releasing section is located in the heat-exchange device 6 and condenses in the heat-exchange device 6 so as to heat the water stored thereinside. The outer surface of the heat-absorbing surface may be provided with high efficient heat absorbing coating thereon such that the heat-absorbing efficiency can be increased as much as possible. The heat-absorbing plate 5 is provided with micro tubes, and is filled with working liquid medium for refrigeration. The working medium is filled in at one end of each micro tube, such that the micro tube becomes a heat pipe. The heat-absorbing surface of the heat-absorbing plate 5 corresponds to the evaporation surface of the novel heat pipe, the heat-releasing surface of the heat-absorbing plate 5 corresponds to the condensation surface of the novel heat pipe, and the heat-collecting water tank may be used as the heat-exchange device 6 for generating hot water. The condensation surface of the novel heat pipe may directly contact with the outside wall of the heat conduction bladder of the heat-collecting water tank. The water in the heat-collecting water tank is heated via heat conduction through the heat conduction bladder when the novel heat pipe condenses and releases heat.

The working principle of this embodiment is as follows. The heat-absorbing section of the heat-absorbing plate 5 absorbs the solar radiation energy; the working medium in the heat pipe evaporates; the hot steam enters the condensation section through pipes, condenses and releases heat, and transfers to liquid phase after heat-exchanging with the water in the heat-exchange device 6; then the liquid flows back to the bottom of the heat-absorbing plate 5; and the liquid evaporates again, and so on. In this way, the heat absorbed by the heat-absorbing plate 5 may be continuously transported to the water in heat-exchange device 6, so the solar energy is utilized.

Micro wick grooves may be formed in micro tubes. The heat-absorbing plate 5 with a plurality of micro wick grooves can render the steam in the evaporation section to move rapidly to the condensation section because of gravity and capillary driving force. Meanwhile the condensed liquid can flow back to the evaporation section quickly for next evaporation in the circulation. Through adjusting the size of micro wick grooves, heat conduction in one single direction of the solar energy collector may be fulfilled, and the heat-absorbing plate of this structure possesses a higher collecting efficiency than prior art collectors.

Figure 11:
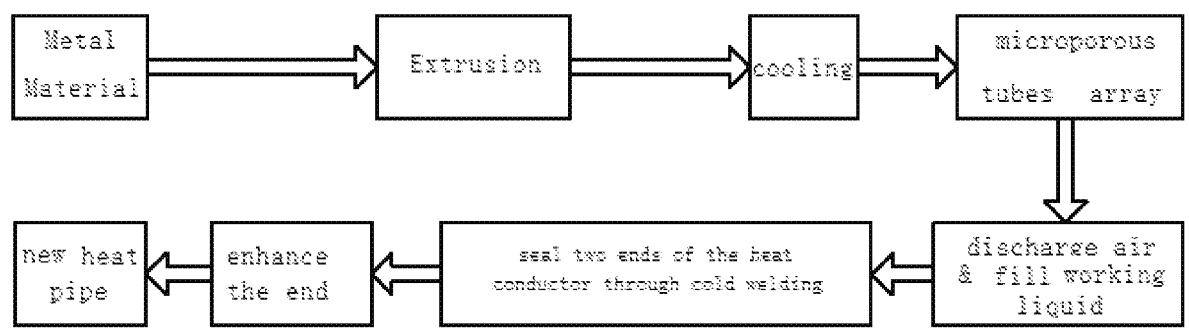
FIG. 11 is a process flow chart illustrating the manufacturing process for the novel heat pipe according to the invention.

FIG. 11 illustrates a flow chart of a preferable process for manufacturing the novel heat pipe according to the invention, which includes following steps.

A. The heat conductor with two or more parallel micro tubes that communicate with each other is produced by extrusion or stamping. The heat conductor may be made of metal material. In this case, metal material is heated to a softening temperature and squeezed into an extrusion die to be extruded. The extrusion die is provided with a flat plate shell on one side thereof. The shell is provided with two or more cylindrical punches therein which are parallel to the shell and arranged side by side. The cylindrical punches are provided with a plurality of micro pits on each side thereof.

B. The metal material is cooled down to room temperature after extrusion, thus forming a plate structure with two or more parallel micro tube arrays that are arranged side by side. Particularly, the micro tubes are formed with a plurality of micro-fins that are produced by extrusion and may functions to enhance heat-exchanging efficiency on the inner wall thereof.

Figure 12:
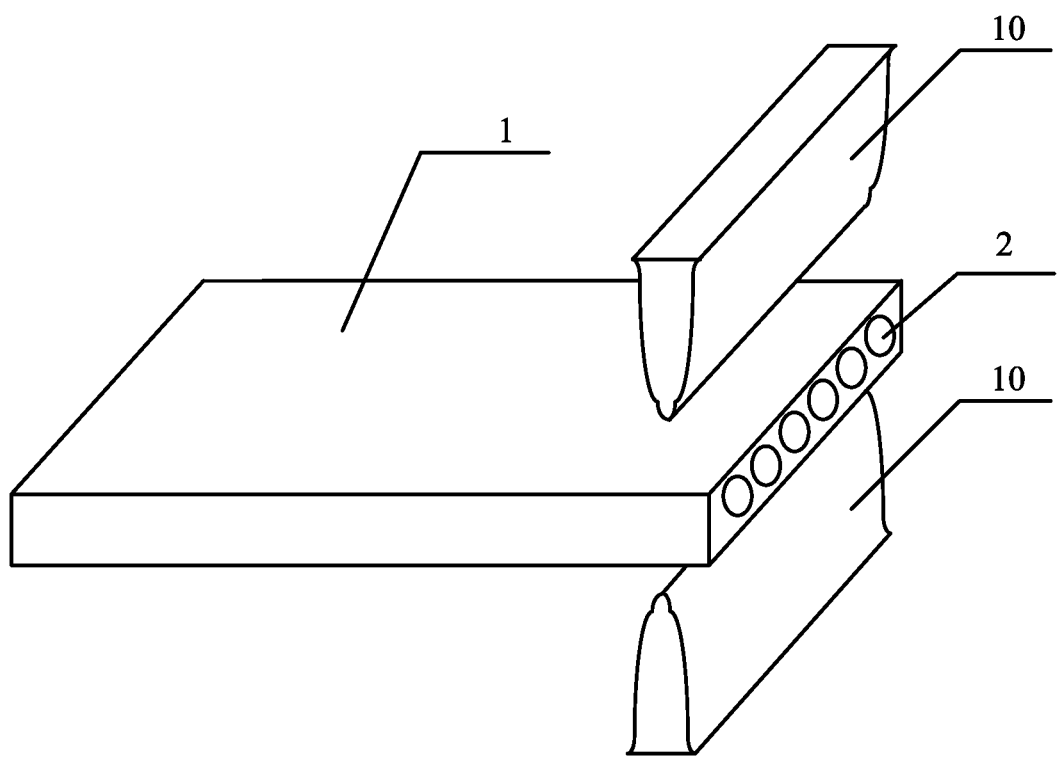
FIG. 12 is the process flow chart used for sealing the end of the heat conductor of the novel heat pipe according to the invention.
Figure 13:
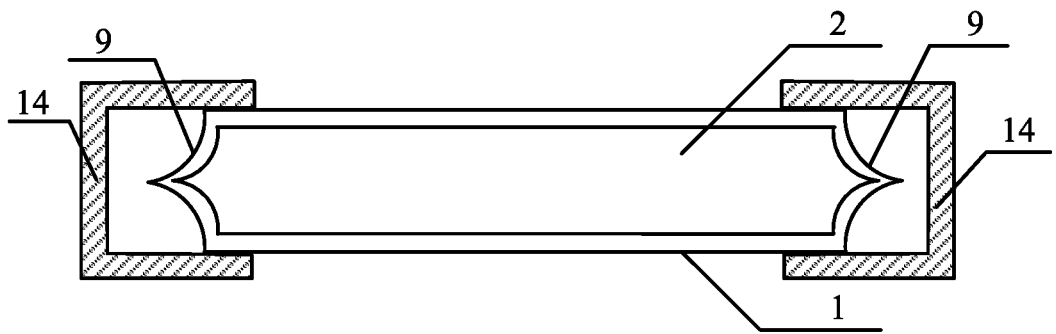
FIG. 13 is a schematic structure view of the longitudinal section of the novel heat pipe with protective caps in each ends of the conductor according to the invention.
Figure 14A:
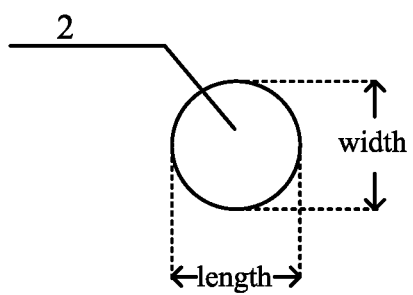
FIG. 14a is a schematic view of the length and width for a circular shape cross section of a micro tube according to the invention.
Figure 14B:
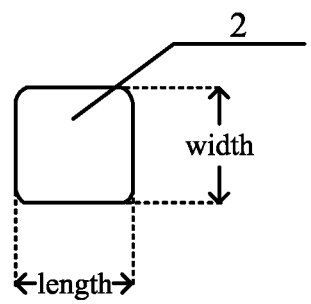
FIG. 14b is a schematic view of the length and width for a rectangle shape cross section of a micro tube according to the invention.
Figure 15:
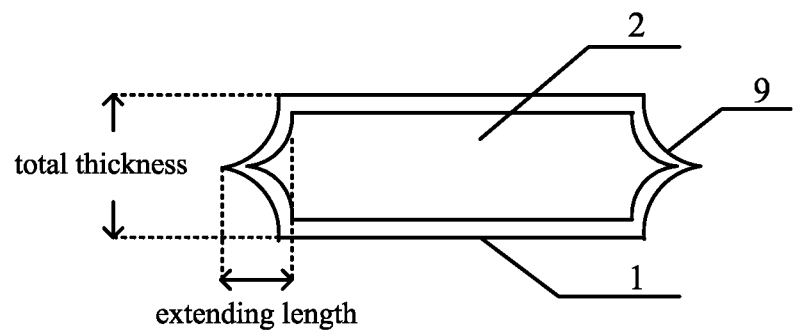
FIG. 15 is a schematic structure view of the longitudinal section of the novel heat pipe showing the extending length and total thickness of a micro tube of the conductor according to the invention
Figure 18:
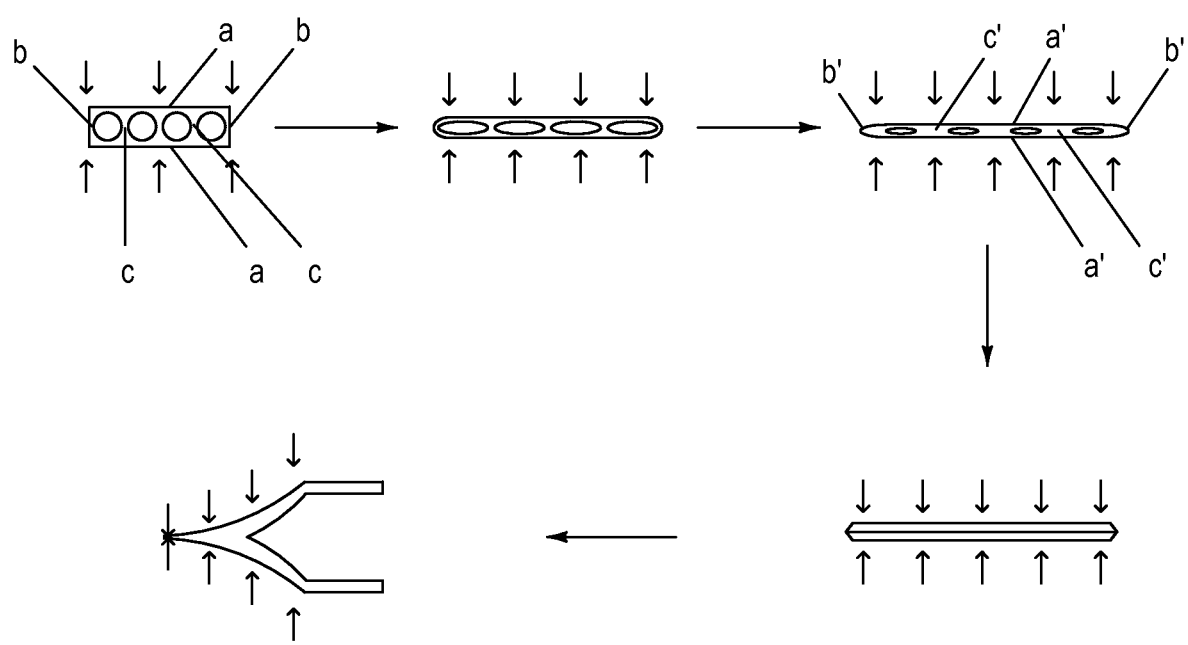
FIG. 18 is a schematic view of a progressive stages of a cold-weld sealing process on the example heat pipe of FIG. 2, as performed by the apparatus disclosed in FIG. 12.
Figure 19:
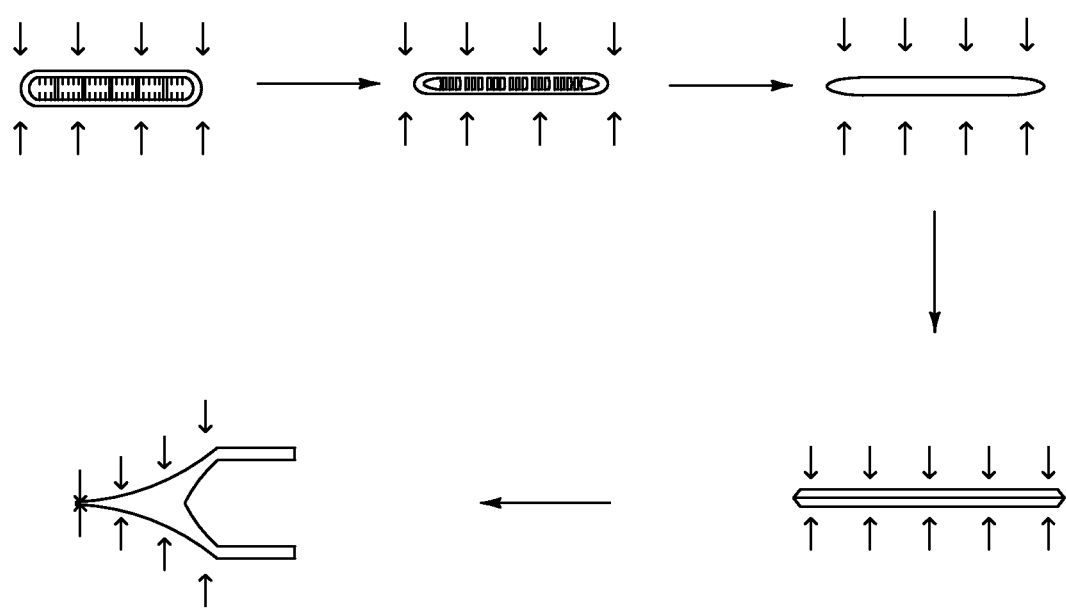
FIG. 19 is a schematic view of a progressive stages of a cold-weld sealing process on an example heat pipe that is similar to the example heat pipe of Figure, as performed by the apparatus disclosed in FIG. 12.

C. One end of the heat conductor is sealed. Of three approaches that may be employed to fulfill this, the approach of cold welding is schematically shown in FIG. 12, and FIG. 18 and FIG. 19, illustrating the process to seal the end of the heat conductor of the novel heat pipe according to the invention, in which the end of the heat conductor is placed between two knife tools 10, the end of the heat conductor 1 is squeezed by the knife-edges of the knife tools, and thus is deformed and is cut off. As shown in FIG. 18, the heat tube includes upper and lower walls 'a,' two outer side walls 'b,' as well as midwalls 'c' between adjacent micro tubes. The arrows represent crushing forces exerted by knife tools 10 such as are disclosed in FIG. 12. Deformed versions of the upper and lower walls, outer side walls, and midwalls are respectively denoted as 'a',' 'b',' and 'c'.' The disclosure of FIG. 19 is the same as FIG. 18 except that FIG. 19 illustrates a different heat pipe configuration (see, e.g., FIG. 5) than what is disclosed in FIG. 18. In the second approach, the end of the heat conductor is first squashed and curled, and then solder or high frequency welding is employed to reinforce the end. In the third approach the end of the heat conductor is sleeved to be sealed.

D. The air in the micro tubes is discharged and the liquid working medium is filled thereinto so as to form micro heat pipes.

E. The other end of the heat conductor is sealed through cold welding, as shown in FIG. 12 which illustrates the flow chart of the process used to seal the end of the heat conductor of the novel heat pipe according to the invention. In the process the end of the heat conductor is placed between two knife tools 10, then the end of the heat conductor 1 is squeezed through the knife-tools 10, and thus is deformed and cut off. Alternatively, an aluminum wire may be inserted into the micro tube 2 in advance and then the end thereof is sealed through cold welding.

F. Each end of the heat conductor is capped with a protective cap. Sleeves may be chosen as the protective cap to seal the end which can enhance the welding effect.

Figure 1:
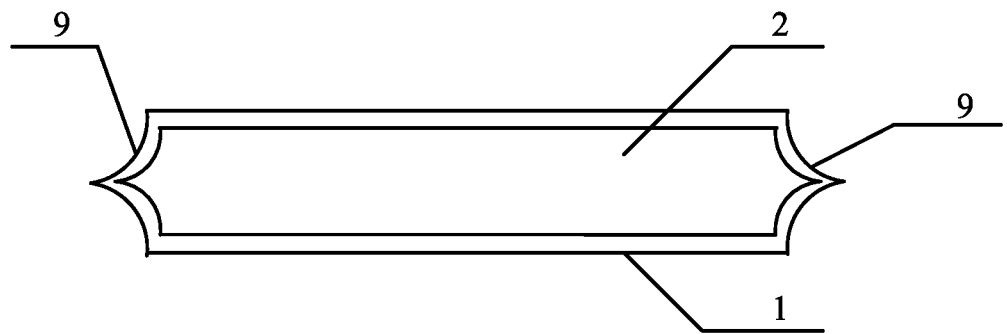
FIG. 1 is the schematic structure view of the longitudinal section of the novel heat pipe according to the invention.

FIG. 3 illustrates the second embodiment of the novel heat pipe according to the invention which is produced through the above process, with its longitude section shown in FIG. 1. In the case there are no micro pits provided on the cylindrical punch of the extrusion die, the inner wall of micro tube in the novel heat pipe has no micro-fins, resulting in the first embodiment of the novel heat pipe as shown in FIG. 2.

In addition to the process employed in this embodiment for manufacturing the novel heat pipe, that is, hot extrusion, the approach of cold extrusion or warm extrusion may also be employed. The extrusion die used in cold extrusion or warm extrusion should be of high hardness and be resistant against wear, and there needs higher pressure to extrude the metal material. Thus the cost of cold extrusion or warm extrusion is higher than that of hot extrusion. Nevertheless, the evenness and smoothness of the resulting product is much desirable than the resulting product from hot extrusion. Of course, punching technology may also be employed to manufacture the novel heat pipe according to the invention, in which the stamping die with two or more parallel cylindrical punches is used to stamp the hot conductor. This punching process is particularly suitable for the case of manufacture the heat pipe of shorter length. The process of hot punching, warm punching or cold punching may be employed. The novel heat pipe is holistically produced through extrusion or punching. Thus the whole processes become easier. Specifically, production of micro wicks, maintenance associated with prior art processes of manufacturing the hot pipes, and brazing process to manufacture the integral body in a brazing furnace are dispensed with. Furthermore, the manufacturing process according to the invention are suitable for industrial mass production in the sense that heat conductors can be massively arranged on the production line, and be delivered to the next step after extrusion or stamping. It is easy to produce heat pipes in large quantity, so the production efficiency is high.

It should be noted that the specific method described above is intended to make the invention clear to the skilled in the prior art. The description will not limit the invention in any way. Therefore, although the invention has been described in the description with reference to the accompanying figures, the skilled in the art should understand that the embodiments or the elements thereof could be modified, changed or substituted without departing from the spirit and the scope of invention that is defined by the claims.

What is claimed is:

1. A heat pipe with micro tube arrays, the heat pipe comprising:
   a solid heat conductor having an integral structure including a first end and a second end opposite the first end, wherein the solid heat conductor forms an integral plane;
   two or more parallel through micro tubes within the solid heat conductor, each of the micro tubes comprising:
      a working medium that is operable to exchange heat through phase change;
      a sealed end at the first end of the solid heat conductor, the sealed end closing each of the two or more parallel through micro tubes from communication with each other at the sealed end, the two or more parallel through micro tubes sealed from communication with each other in a half of the solid heat conductor that includes the first end; and
   the first end of the solid heat conductor comprising upper walls and lower walls of the micro tubes, the first end including the sealed end of the two or more parallel through micro tubes;
   two outer side walls of two micro tubes located at two sides of the solid heat conductor;
   midwalls separating every two adjacent micro tubes, wherein neighboring micro tubes share a common midwall;
   a homogenous sealing strip forming the sealed end of the two or more parallel through micro tubes and comprising homogenous material of the upper walls, lower walls and midwalls that is deformed from portions of the upper and lower walls, portions of the outer side walls, and portions of the midwalls;
   wherein at least one solid strip is provided within the solid heat conductor and extends in a direction parallel to a length direction of the micro tubes, and has a same height as a height of the solid heat conductor; and
   an acute tip line providing resistance to inner pressure, wherein the sealing strip has a thickness formed by two arcs that gradually and continuously decreases toward an acute tip point.

2. The heat pipe with micro tube arrays according to claim 1, wherein the deformation includes first and second concave surfaces that converge with each other to form the tip of the deformation, where the tip of the deformation is oriented transverse to a length of the solid heat conductor.

3. The heat pipe with micro tube arrays according to claim 1, wherein the solid heat conductor is provided with protective caps around the outer part of the end where the sealing strip is located.

4. The heat pipe with micro tube arrays according to claim 3, wherein the micro tubes are arranged in parallel in a layer along a surface of the solid heat conductor that contacts with a surface of a device to be cooled.

5. The heat pipe with micro tube arrays according to claim 3, wherein the solid heat conductor is a strip-shaped or plate-shape body, and the parallel micro tubes are parallel to a surface of the strip-shaped or plate-shape body that is wider in a cross direction.

6. The heat pipe with micro tube arrays according to claim 5, wherein a ratio of a length to a width of a cross-section of the passage of the micro tubes is between ⅔ and 1.5, and a ratio of a minimal wall thickness of the heat pipe and an equivalent diameter of the micro tubes is not less than 0.2.

7. The heat pipe with micro tube arrays according to claim 6, wherein the ratio of an extending length of the gradually shrinking sealing strip to a total thickness of the heat conductor ranges from 0.75 to 1.5 in the case that the total thickness of the heat conductor is less than 3 mm, the ratio ranges from 0.6 to 1.5 in the case that the total thickness of the heat conductor is 3 mm to 5 mm, and the ratio ranges from 0.5 to 1.5 in the case that the total thickness of the heat conductor is greater than 5 mm.

8. The heat pipe with micro tube arrays according to claim 7, wherein the equivalent diameter or a hydraulic diameter of one of the micro tubes is between 0.1 mm and 8 mm, and the distance between two adjacent micro tubes is between 0.1 mm and 1.0 mm.

9. The heat pipe with micro tube arrays according to claim 7, wherein the at least one solid strip comprises one or more solid strips and one of the solid strips is arranged in a central portion of the solid heat conductor is provided with mounting holes.

10. The heat pipe with micro tube arrays according to claim 7, wherein the cross-section of the micro tube is polygonal, circular or oval; and in the case of polygonal cross-section, the vertexes of the polygon are rounded.

11. The heat pipe with micro tube arrays according to claim 7, wherein an inner wall of each micro tube is provided with micro-fins that enhance heat conduction or concave micro grooves that extend along the length direction of the micro tube; the micro-fins are sized and configured to form, with the inner walls of the micro tubes, micro grooves extending along the length direction of the micro tubes; angles formed between the micro-fins and the inner wall of the micro tube and angles formed between the micro grooves and the inner wall of the micro tube are smoothly rounded angles.

12. The heat pipe with micro tube arrays according to claim 1, wherein the micro tubes are arranged in two or more layers.

13. A heat-exchange system that employs the heat pipe with micro tube arrays according to claim 1.

14. The heat-exchange system according to claim 13, wherein an evaporation surface of the heat pipe contacts with a surface of devices to be cooled, and another portion of the heat pipe is a condensation surface.

15. The heat-exchange system according to claim 14, wherein the heat-exchange system functions as a heat collector for a solar water heater, wherein solar radiation energy is absorbed and the liquid working medium evaporates at one end of the micro tubes; exothermic condensation occurs at the other end and heat is transferred to a heat-exchange device so as to generate hot water; and the condensation surface of the heat pipe contacts with water in the heat-exchange device directly or alternatively contacts with an outside wall of a heat-conduction bladder of a hot water tank that functions as the heat collector.

16. The heat-exchange system according to claim 14, wherein the heat-exchange system functions as a heat sink for solar photovoltaic cells or functions as combined heat and power generation system wherein the evaporation surface of the heat pipe contacts with a back plate of the solar photovoltaic cells so as to absorb heat therefrom to evaporate the working medium, and the condensation surface of the heat pipe condenses the working medium in the heat-exchange system so as to generate hot water.

17. The heat-exchange system according to claim 13, wherein one end of the heat pipe is located in a heat source, and absorbs heat therefrom to evaporate the working medium; the other end of the heat pipe is cooled through air or liquid from outside; and exothermic condensation is carried out by steam within the heat pipe.

18. The heat pipe with micro tube arrays according to claim 1, wherein the homogenous sealing strip is formed without solder.

19. The heat pipe with micro tube arrays according to claim 1, wherein the heat pipe is formed from a homogenous material, and the homogenous sealing strip is a homogenous cold weld formed from the homogenous material of the heat pipe.

20. The heat pipe with micro tube arrays according to claim 1, wherein the second end of the solid heat conductor is sealed and the two or more parallel through micro tubes are in fluid communication with each other in a half of the solid heat conductor that includes the second end.

* * * * *